United States Patent
Lee et al.

(10) Patent No.: US 10,593,558 B2
(45) Date of Patent: Mar. 17, 2020

(54) METHOD OF MANUFACTURING SOLAR CELL

(71) Applicant: LG ELECTRONICS INC., Seoul (KR)

(72) Inventors: Kyoungsoo Lee, Seoul (KR);
Sunghyun Hwang, Seoul (KR);
Sangwook Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/866,052

(22) Filed: Jan. 9, 2018

(65) Prior Publication Data

US 2018/0204737 A1   Jul. 19, 2018

(30) Foreign Application Priority Data

Jan. 17, 2017  (KR) ........................ 10-2017-0008116

(51) Int. Cl.
*H01L 21/00* (2006.01)
*H01L 21/3205* (2006.01)
(Continued)

(52) U.S. Cl.
CPC .. *H01L 21/32055* (2013.01); *H01L 21/02592* (2013.01); *H01L 21/28* (2013.01);
(Continued)

(58) Field of Classification Search
CPC ......... H01L 21/02592; H01L 21/32055; H01L 31/0376; H01L 31/03762; H01L 31/035245
(Continued)

(56) References Cited

U.S. PATENT DOCUMENTS 6,468,885 B1 * 10/2002 Mahan .................. C23C 16/24
257/E21.101
8,049,101 B2 * 11/2011 Terakawa ............ H01L 31/0747
136/243
(Continued)

FOREIGN PATENT DOCUMENTS

DE  602004032509 A1  5/2011
EP     1555695 A1  7/2005
(Continued)

OTHER PUBLICATIONS

Huang et al., "The Effect of $H_2$ Treatment on Heterojunction with Intrinsic Thin Layer (HIT) Solar Cell Performance Using 40.68MHz VHF-PECVD System," 37th IEEE Photovoltaic Specialist Conference (PVSC), 2011 (Jun. 19, 2011), pp. 03001-03004, XP032168318.
(Continued)

*Primary Examiner* — Hsien Ming Lee
(74) *Attorney, Agent, or Firm* — Birch, Stewart, Kolasch & Birch, LLP (57) ABSTRACT

A method of manufacturing a solar cell is disclosed. The method of manufacturing the solar cell includes depositing an intrinsic amorphous silicon layer on a surface of a semiconductor substrate, depositing an amorphous silicon layer containing impurities on the intrinsic amorphous silicon layer to form a conductive region, and forming an electrode electrically connected to the conductive region. The depositing of the intrinsic amorphous silicon layer includes depositing the intrinsic amorphous silicon on the surface of the semiconductor substrate at a deposition rate of 0.5 nm/sec to 2.0 nm/sec.

12 Claims, 8 Drawing Sheets

(51) Int. Cl.
*H01L 21/28* (2006.01)
*H01L 21/02* (2006.01)
*H01L 31/072* (2012.01)
*H01L 31/0747* (2012.01)
*H01L 31/18* (2006.01)
*H01L 31/20* (2006.01)

(52) U.S. Cl.
CPC ........ *H01L 31/072* (2013.01); *H01L 31/0747* (2013.01); *H01L 31/1804* (2013.01); *H01L 31/202* (2013.01); *Y02E 10/547* (2013.01); *Y02P 70/521* (2015.11)

(58) Field of Classification Search
USPC .............. 438/22, 24, 47; 257/52, 53, 79–81
See application file for complete search history.

(56) References Cited

U.S. PATENT DOCUMENTS

| | | | | |
|---|---|---|---|---|
| 8,815,662 | B2* | 8/2014 | Noda | H01L 31/02245 438/166 |
| 2009/0020154 | A1 | 1/2009 | Sheng et al. | |
| 2013/0102133 | A1 | 4/2013 | Sheng et al. | |
| 2013/0210185 | A1* | 8/2013 | Yoshimi | H01L 31/1804 438/57 |
| 2014/0217408 | A1* | 8/2014 | Hong | H01L 31/03762 257/53 |
| 2014/0299187 | A1* | 10/2014 | Chang | H01L 31/0747 136/258 |
| 2016/0233368 | A1* | 8/2016 | Ogane | H01L 31/0747 |
| 2018/0006165 | A1 | 1/2018 | Yoshikawa et al. | |
| 2018/0062005 | A1* | 3/2018 | Uto | H01L 31/0747 |

FOREIGN PATENT DOCUMENTS

| | | |
|---|---|---|
| JP | 200-307134 A | 11/2000 |
| JP | 2003-158078 A | 5/2003 |
| JP | 2003-197536 A | 7/2003 |
| JP | 2004-165394 A | 6/2004 |
| JP | 2004-247607 A | 9/2004 |
| JP | 2004-363579 A | 12/2004 |
| JP | 2005-229089 A | 8/2005 |
| JP | 2013-98241 A | 5/2013 |
| JP | 2014-103259 A | 6/2014 |
| KR | 10-1998-0071510 A | 10/1998 |
| KR | 10-2010-0053050 A | 5/2010 |
| KR | 10-2010-0089856 A | 8/2010 |
| KR | 10-2010-0136554 A | 12/2010 |
| WO | WO 2014/148443 A1 | 9/2014 |
| WO | WO 2016/111339 A1 | 7/2016 |

OTHER PUBLICATIONS

Kakiuchi et al., "Characterization of Intrinsic Amorphous Silicon Layers for Solar Cells Prepared at Extremely High Rates by Atmospheric Pressure Plasma Chemical Vapor Deposition," Journal of Non-Crystalline Solids, vol. 351, No. 8-9, 2005 (Apr. 1, 2005), pp. 741-747, XP027660725.

* cited by examiner

METHOD OF MANUFACTURING SOLAR CELL

CROSS-REFERENCE TO RELATED APPLICATION

This application claims the priority benefit of the Korean Patent Application No. 10-2017-0008116 filed on Jan. 17, 2017, which is hereby incorporated by reference in its entirety.

BACKGROUND OF THE INVENTION

Field of the Invention

Embodiments of the invention relate to a method of manufacturing a solar cell.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes by the incident light. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

A plurality of solar cells having the above-described configuration may be connected to one another through interconnectors to form a module.

In general, a related art solar cell was configured such that conductive impurities were diffused into a semiconductor substrate to form an emitter region or a back surface filed region.

Alternatively, the related art solar cell was configured such that amorphous silicon containing impurities was formed on a surface of the semiconductor substrate to form the emitter region or the back surface filed region, in order to further improve an output voltage of the solar cell.

However, when amorphous silicon was formed on the surface of the semiconductor substrate, a portion of amorphous silicon was epitaxial grown and crystallized along a crystal orientation of the surface of the semiconductor substrate due to material properties of the semiconductor substrate having a crystalline structure even when an amorphous silicon layer was deposited. Hence, there was a problem that interface characteristics were deteriorated such that silicon crystals were formed in a portion of the amorphous silicon layer.

When the silicon crystals were formed in a portion of the amorphous silicon layer as described above, the silicon crystals served as impurities or a defect. Hence, there was a problem that an open-circuit voltage Voc of the solar cell was reduced.

Accordingly, in order to solve the problem that a portion of the amorphous silicon layer was crystallized, a method of increasing a pressure of the amorphous silicon layer in a process for depositing the amorphous silicon layer was introduced. However, the method had a problem that the manufacturing cost of the solar cell excessively increased because the excessive cost was required to match the process conditions.

SUMMARY OF THE INVENTION

Embodiments of the invention provide a method of manufacturing a solar cell capable of implementing a pure amorphous silicon layer, in which silicon crystals are not formed, while reducing the manufacturing cost.

In one aspect, there is provided a method of manufacturing a solar cell including depositing an intrinsic amorphous silicon layer on a surface of a semiconductor substrate, depositing an amorphous silicon layer containing impurities on the intrinsic amorphous silicon layer to form a conductive region, and forming an electrode electrically connected to the conductive region, wherein the depositing of the intrinsic amorphous silicon layer includes depositing the intrinsic amorphous silicon on the surface of the semiconductor substrate at a deposition rate of approximately 0.5 nm/sec to approximately 2.0 nm/sec.

A power density of a deposition device for depositing the intrinsic amorphous silicon layer may be approximately 60 mW/cm$^2$ to approximately 150 mW/cm$^2$.

A ratio of an amount (sccm) of hydrogen gas ($H_2$) to an amount (sccm) of silane ($SiH_4$) gas for depositing the intrinsic amorphous silicon layer may be approximately 1:1 to approximately 1:100.

A process temperature in the depositing of the intrinsic amorphous silicon layer may be approximately 100° C. to approximately 200° C.

The intrinsic amorphous silicon layer may be deposited on a first surface and a second surface of the semiconductor substrate.

The forming of the conductive region may include forming the amorphous silicon layer containing impurities on the intrinsic amorphous silicon layer formed on the first surface of the semiconductor substrate to form a first conductive region, and forming an amorphous silicon layer containing impurities of a conductivity type opposite a conductivity type of the impurities contained in the first conductive region on the intrinsic amorphous silicon layer formed on the second surface of the semiconductor substrate to form a second conductive region.

The method may further include forming a transparent electrode layer formed of transparent conductive oxide on the conductive region between the forming of the conductive region and the forming of the electrode. In the forming of the electrode, the electrode may be connected to the transparent electrode layer.

The intrinsic amorphous silicon layer may include a first intrinsic amorphous silicon layer formed on the first surface of the semiconductor substrate and a second intrinsic amorphous silicon layer formed on the second surface of the semiconductor substrate. The first conductive region and the semiconductor substrate may form a p-n junction with the first intrinsic amorphous silicon layer interposed therebetween. A deposition rate of the first intrinsic amorphous silicon layer may be different from a deposition rate of the second intrinsic amorphous silicon layer.

The deposition rate of the first intrinsic amorphous silicon layer may be greater than the deposition rate of the second intrinsic amorphous silicon layer.

The method of manufacturing the solar cell according to embodiments of the invention can implement a pure amorphous silicon layer in which silicon crystals are not formed without high-pressure process conditions requiring the high cost by depositing the intrinsic amorphous silicon layer on the surface of the semiconductor substrate at the deposition rate of 0.5 nm/sec to 2.0 nm/sec.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" may be one surface of a semiconductor substrate, on which light is directly incident, and "back surface" may be a surface opposite the one surface of the semiconductor substrate, on which light is not directly incident or reflective light may be incident.

Figure 1:
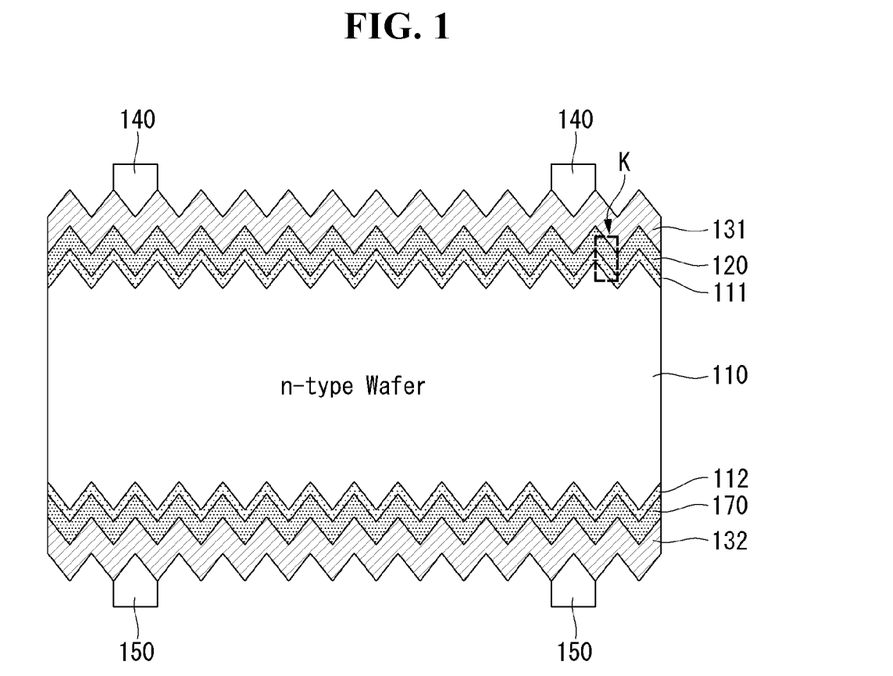
FIG. 1 illustrates an example of a solar cell manufactured through a method of manufacturing a solar cell according to an embodiment of the invention.
Figure 2:
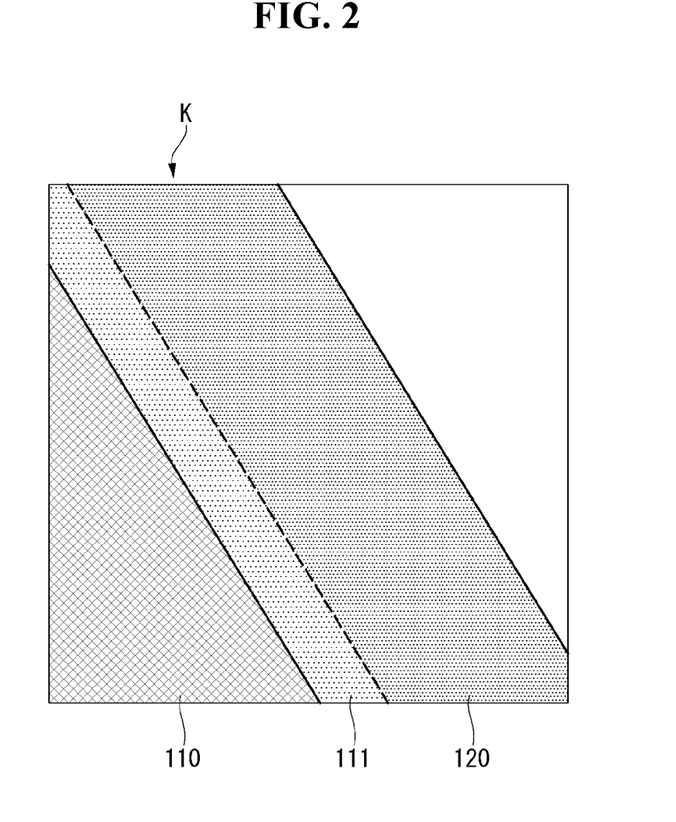
FIG. 2 is an enlarged view of a portion K shown in FIG. 1.

FIG. 1 illustrates an example of a solar cell manufactured through a method of manufacturing a solar cell according to an embodiment of the invention. FIG. 2 is an enlarged view of a portion K shown in FIG. 1.

As shown in FIG. 1, an example of a solar cell according to an embodiment of the invention may include a semiconductor substrate 110, a first intrinsic amorphous silicon layer 111 on a first surface of the semiconductor substrate 110, a first conductive region 120, a first transparent electrode layer 131, a plurality of first electrode 140, a second intrinsic amorphous silicon layer 112 on a second surface of the semiconductor substrate 110, a second conductive region 170, a second transparent electrode layer 132, and a plurality of second electrode 150.

In embodiments disclosed herein, the first and second transparent electrode layers 131 and 132 may be omitted, if desired or necessary. However, when the first and second transparent electrode layers 131 and 132 are provided, a contact resistance between the first and second electrodes 140 and 150 and the first and second conductive regions 120 and 170 can be further reduced. Thus, embodiments of the invention are described using an example where the first and second transparent electrode layers 131 and 132 are provided.

The semiconductor substrate 110 may be formed of at least one of single crystal silicon and polycrystalline silicon containing impurities of a first conductivity type or a second conductivity type. For example, the semiconductor substrate 110 may be formed of a single crystal silicon wafer.

In embodiments disclosed herein, the first conductivity type or the second conductivity type of the semiconductor substrate 110 may be one of an n-type and a p-type.

When the semiconductor substrate 110 is of the p-type, the semiconductor substrate 110 may be doped with impurities of a group III element such as boron (B), gallium (Ga), and indium (In). Alternatively, when the semiconductor substrate 110 is of the n-type, the semiconductor substrate 110 may be doped with impurities of a group V element such as phosphorus (P), arsenic (As), and antimony (Sb).

In the following description, embodiments of the invention are described using an example where impurities contained in the semiconductor substrate 110 are impurities of the second conductivity type and are n-type impurities. However, embodiments are not limited thereto.

As shown in FIG. 1, the first and second surfaces of the semiconductor substrate 110 may be an uneven surface having a plurality of uneven portions or having uneven characteristics.

Hence, an amount of light reflected from the first and second surfaces of the semiconductor substrate 110 can decrease, and an amount of light incident on the inside of the semiconductor substrate 110 can increase.

In embodiments disclosed herein, the first surface and the second surface of the semiconductor substrate 110 may be a front surface and a back surface, respectively. However, embodiments are not limited thereto. For example, the first surface and the second surface of the semiconductor substrate 110 may be a back surface and a front surface, respectively.

The first and second intrinsic amorphous silicon layers 111 and 112 may be entirely positioned on the first surface and the second surface of the semiconductor substrate 110, respectively and may be formed of an intrinsic amorphous silicon material not containing impurities of the first and second conductivity types.

For example, the first intrinsic amorphous silicon layer 111 may be entirely positioned on the first surface of the semiconductor substrate 110, and the second intrinsic amorphous silicon layer 112 may be entirely positioned on the second surface of the semiconductor substrate 110.

The first and second intrinsic amorphous silicon layers 111 and 112 form a heterojunction together with the semiconductor substrate 110 formed of a crystalline silicon material and thus can further increase an open-circuit voltage Voc of the solar cell.

Further, the first and second intrinsic amorphous silicon layers 111 and 112 contain hydrogen and thus can perform a passivation function of a defect existing at the surface of the semiconductor substrate 110.

A thickness of each of the first and second intrinsic amorphous silicon layers 111 and 112 may be 0.5 nm to 2.5 nm and may serve as a tunnel layer passing carriers generated in the semiconductor substrate 110.

As shown in FIG. 1, the first conductive region 120 may be entirely positioned on the first intrinsic amorphous silicon layer 111 and may be formed as an amorphous silicon layer containing impurities of the first conductivity type.

When the semiconductor substrate 110 contains impurities of the first conductivity type, the first conductive region 120 may serve as a field region because a concentration of the impurities of the first conductivity type contained in the first conductive region 120 is higher than a concentration of the impurities of the first conductivity type contained in the semiconductor substrate 110. Alternatively, when the semiconductor substrate 110 contains impurities of the second conductivity type, the first conductive region 120 may form a p-n junction together with the semiconductor substrate 110 and may serve as an emitter region.

In the following description, embodiments of the invention are described using an example where the first conductive region 120 serves as the emitter region.

Hence, the first conductive region 120 can allow holes of carriers generated in the semiconductor substrate 110 to easily move to the first conductive region 120.

A thickness of the first conductive region 120 may be greater than a thickness of the first intrinsic amorphous silicon layer 111.

As shown in FIG. 1, the second conductive region 170 may be entirely positioned on the second intrinsic amorphous silicon layer 112 and may be formed as an amorphous silicon layer containing impurities of the second conductivity type opposite the first conductivity type of impurities contained in the first conductive region 120.

When the semiconductor substrate 110 contains impurities of the second conductivity type, the second conductive region 170 may serve as a field region because a concentration of the impurities of the second conductivity type contained in the second conductive region 170 is higher than a concentration of the impurities of the second conductivity type contained in the semiconductor substrate 110. Alternatively, when the semiconductor substrate 110 contains impurities of the first conductivity type, the second conductive region 170 may form a p-n junction together with the semiconductor substrate 110 and may serve as an emitter region.

In the following description, embodiments of the invention are described using an example where the second conductive region 170 serves as a back surface field region.

Hence, the second conductive region 170 can allow electrons of carriers generated in the semiconductor substrate 110 to easily move to the second conductive region 170.

The first and second transparent electrode layers 131 and 132 may be positioned on the first and second conductive regions 120 and 170, respectively.

The first and second transparent electrode layers 131 and 132 form an ohmic contact together with the first and second conductive regions 120 and 170 formed of an amorphous silicon material, respectively. Hence, the first and second transparent electrode layers 131 and 132 can minimize a contact resistance between the first and second transparent electrode layers 131 and 132 and the first and second conductive regions 120 and 170 and secure a transmittance of light incident on the first and second conductive regions 120 and 170 at a predetermined level or more.

The first and second transparent electrode layers 131 and 132 may be formed of transparent conductive oxide (TCO). For example, indium tin oxide (ITO), tin dioxide ($SnO_2$), etc. may be used.

The first electrodes 140 may be positioned on the first transparent electrode layer 131 and connected to the first conductive region 120 through the first transparent electrode layer 131. The first electrodes 140 may collect carriers (e.g., holes) moving to the first conductive region 120.

The second electrodes 150 may be positioned on the second transparent electrode layer 132 and connected to the second conductive region 170 through the second transparent electrode layer 132. The first electrodes 140 may collect carriers (e.g., electrons) moving to the second conductive region 170.

In the solar cell having the above-described structure according to the embodiment of the invention, holes collected by the first electrodes 140 and electrons collected by the second electrodes 150 may be used as electric power of an external device through an external circuit device.

The solar cell according to the embodiment of the invention is not limited to FIG. 1. Other components of the solar cell according to the embodiment of the invention may be variously changed, except that the intrinsic amorphous silicon layer is positioned on the surface of the semiconductor substrate 110.

In the above-described solar cell according to the embodiment of the invention, the first and second intrinsic amorphous silicon layers 111 and 112 are positioned on the surface of the semiconductor substrate 110 and thus can further increase the open-circuit voltage of the solar cell.

As shown in FIG. 2, because the intrinsic amorphous silicon layer is positioned on the surface of the semiconductor substrate 110 and does not include a silicon crystal that is a factor of a reduction in the open-circuit voltage, the intrinsic amorphous silicon layer can further improve the open-circuit voltage of the solar cell.

Namely, the method of manufacturing the solar cell according to the embodiment of the invention completely suppresses an epitaxial growth generating the silicon crystal and can prevent degradation in characteristics of an amorphous silicon layer.

A method of manufacturing a solar cell according to an embodiment of the invention suppressing the epitaxial growth will be described below.

Figure 3:
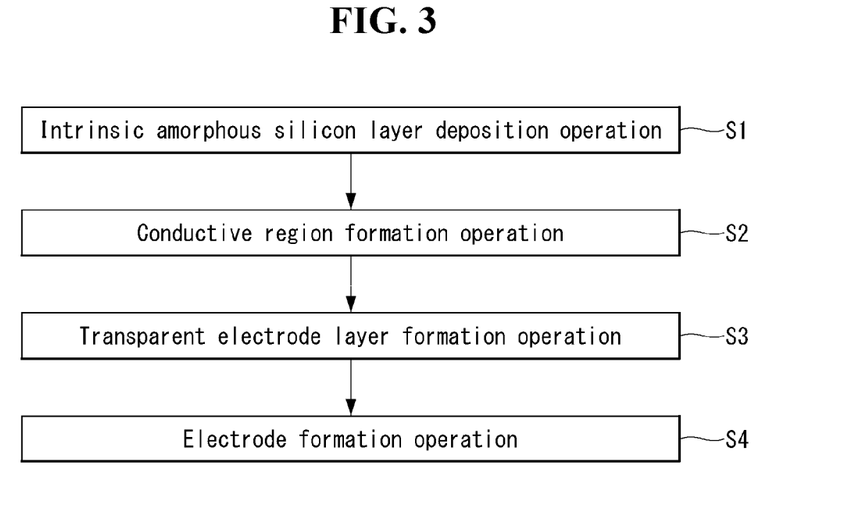
FIG. 3 illustrates a method of manufacturing a solar cell according to an embodiment of the invention.

FIG. 3 illustrates a method of manufacturing a solar cell according to an embodiment of the invention.

A method of manufacturing a solar cell according to an embodiment of the invention may include an intrinsic amorphous silicon layer deposition operation S1, a conductive region formation operation S2, a transparent electrode layer formation operation S3, and an electrode formation operation S4.

In embodiments disclosed herein, the transparent electrode layer formation operation S3 may be omitted, if desired or necessary. However, when an ohmic contact is formed between an electrode and a conductive region, efficiency of the solar cell can be improved. Thus, embodiments of the invention are described using an example where the transparent electrode layer formation operation S3 is included.

In the intrinsic amorphous silicon layer deposition operation S1, an intrinsic amorphous silicon layer may be deposited on a first surface and a second surface of a semiconductor substrate 110 using a chemical vapor deposition (CVD) method.

The intrinsic amorphous silicon layer may be deposited on a front surface and a back surface of the semiconductor substrate 110 to form a first intrinsic amorphous silicon layer 111 and a second intrinsic amorphous silicon layer 112 as shown in FIG. 1.

A process temperature in the intrinsic amorphous silicon layer deposition operation S1 may be 100° C. to 200° C.

Process conditions of the intrinsic amorphous silicon layer deposition operation S1 will be described in detail after remaining operations of the method of manufacturing the solar cell are described.

In the conductive region formation operation S2, an amorphous silicon layer containing impurities may be deposited on the first and second intrinsic amorphous silicon layers 111 and 112 to form conductive regions 120 and 170.

For example, the conductive region formation operation S2 may include a first conductive region formation operation of forming an amorphous silicon layer 120 containing impurities on the first intrinsic amorphous silicon layer 111 formed on the first surface of the semiconductor substrate 110 and a second conductive region formation operation of forming an amorphous silicon layer 170 containing impurities of a conductivity type opposite a conductivity type of impurities contained in the first conductive region 120 on the second intrinsic amorphous silicon layer 112 formed on the second surface of the semiconductor substrate 110.

For example, the conductive region formation operation S2 may use the chemical vapor deposition method to form the first and second conductive regions 120 and 170.

Hence, the first conductive region 120 may be formed on the first intrinsic amorphous silicon layer 111, and the second conductive region 170 may be formed on the second intrinsic amorphous silicon layer 112.

Next, the transparent electrode layer formation operation S3 may form transparent conductive oxide (TCO) on the conductive regions 120 and 170.

Hence, a first transparent electrode layer 131 may be formed on the first conductive region 120, and a second transparent electrode layer 132 may be formed on the second conductive region 170.

The first and second transparent electrode layers 131 and 132 may be formed of transparent conductive oxide. For example, ITO, $SnO_2$, etc. may be used.

Next, in the electrode formation operation S4, first and second electrodes 140 and 150 may be patterned and formed on a portion of the first and second transparent electrode layers 131 and 132 as shown in FIG. 1.

Hence, the solar cell shown in FIG. 1 can be manufactured.

The method of manufacturing the solar cell according to the embodiment of the invention can be configured so that a silicon crystal is not at all formed in the intrinsic amorphous silicon layers 111 and 112 deposited in the intrinsic amorphous silicon layer deposition operation S1.

To this end, the embodiment of the invention can limit a deposition rate of the intrinsic amorphous silicon layers 111 and 112 deposited on the surface of the semiconductor substrate 110 to 0.5 nm/sec to 2.0 nm/sec, so that an epitaxial growth is not performed on the surface of the semiconductor substrate 110 in the intrinsic amorphous silicon layer deposition operation S1, and a defect density of the intrinsic amorphous silicon layer is equal to or less than a predetermined level.

This will be described in detail below.

Figure 4:
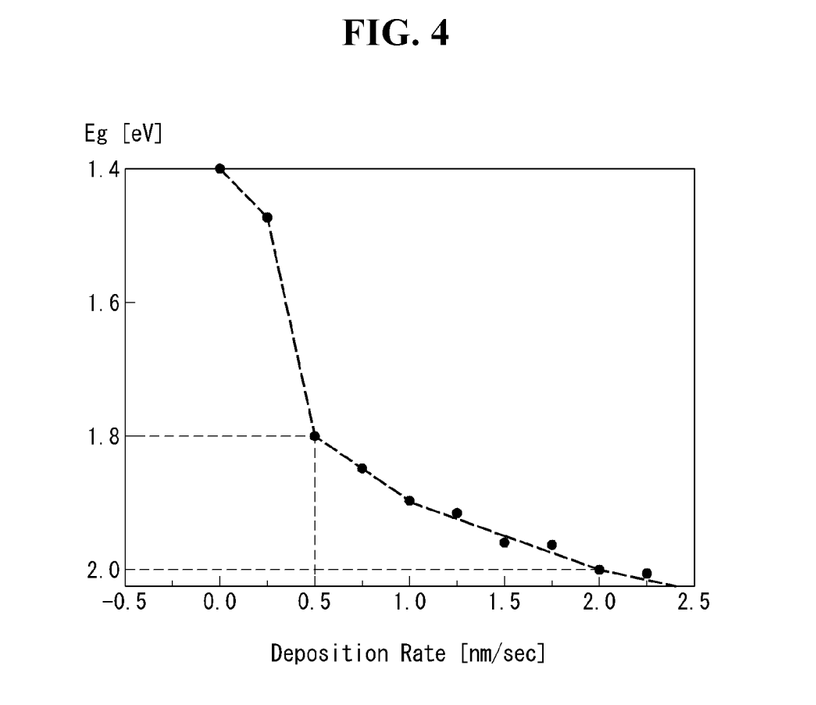
FIG. 4 illustrates an experimental example for explaining an energy band gap of a solar cell depending on a deposition rate when intrinsic amorphous silicon is deposited on a surface of a semiconductor substrate in a manufacturing method of FIG. 3.
Figure 5:
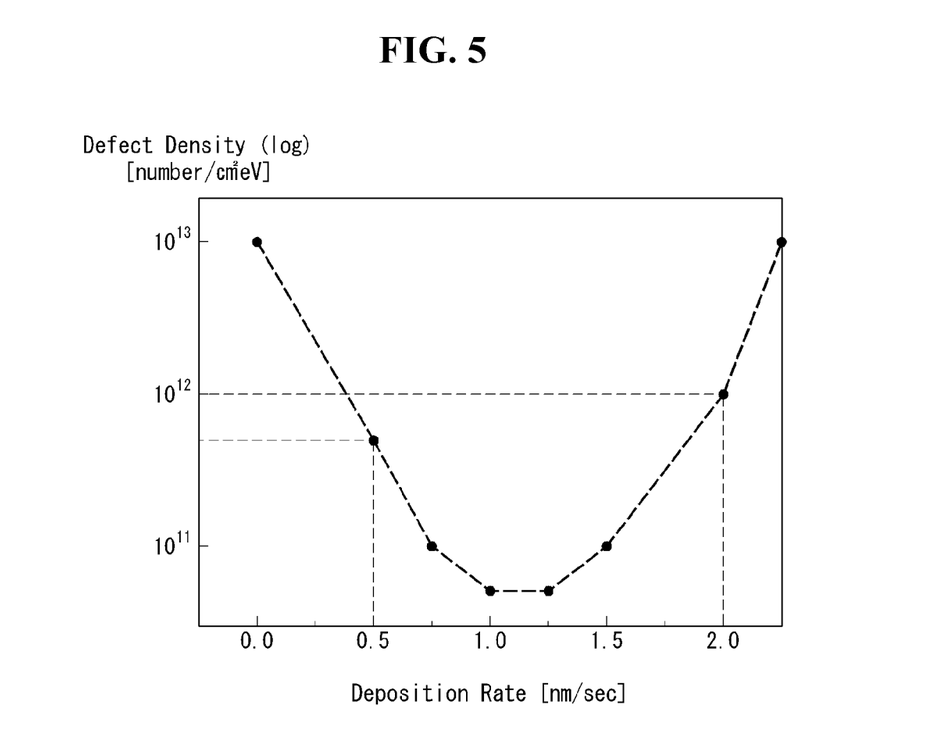
FIG. 5 illustrates an experimental example for explaining a defect density depending on a deposition rate when intrinsic amorphous silicon is deposited on a surface of a semiconductor substrate in a manufacturing method of FIG. 3.

FIG. 4 illustrates an experimental example for explaining an energy band gap of a solar cell depending on a deposition rate when intrinsic amorphous silicon is deposited on a surface of a semiconductor substrate in a manufacturing method of FIG. 3. FIG. 5 illustrates an experimental example for explaining a defect density depending on a deposition rate when intrinsic amorphous silicon is deposited on a surface of a semiconductor substrate in a manufacturing method of FIG. 3.

In the intrinsic amorphous silicon layer deposition operation S1 according to the embodiment of the invention, the intrinsic amorphous silicon layers 111 and 112 may be deposited on the surface of the semiconductor substrate 110 at a deposition rate of 0.5 nm/sec to 2.0 nm/sec.

When the deposition rate is equal to or greater than 0.5 nm/sec, the epitaxial growth is scarcely performed. Hence, the silicon crystal cannot exist inside the intrinsic amorphous silicon layers 111 and 112.

The silicon crystals serve as a defect inside the intrinsic amorphous silicon layers 111 and 112, thereby increases dangling bonds at an interface between the intrinsic amorphous silicon layers 111 and 112 and the crystalline semiconductor substrate 110. Hence, the silicon crystal is a factor of a reduction in a bandgap energy Eg which is an important index of the open-circuit voltage Voc of the solar cell.

When the silicon crystal is not present inside the intrinsic amorphous silicon layers 111 and 112 as described above, the bandgap energy Eg of the solar cell can increase to 1.8 eV or more as shown in FIG. 4.

However, when the deposition rate is less than 0.5 nm/sec, the epitaxial growth is performed. Hence, the silicon crystal may exist inside the intrinsic amorphous silicon layers 111 and 112.

In this instance, as shown in FIG. 4, when the deposition rate was, for example, 0.25 nm/sec, the epitaxial growth was generated. Hence, the bandgap energy Eg of the solar cell was greatly reduced to about 1.5 eV or less.

Further, as shown in FIG. 4, when the deposition rate was 0.5 nm/sec to 2.0 nm/sec, the bandgap energy Eg was about 1.8 eV to 2.0 eV, and a rate of an increase in the bandgap energy Eg was greatly reduced.

When the deposition rate increased or decreased such that it was out of the range of 0.5 nm/sec to 2.0 nm/sec, a defect density inside the intrinsic amorphous silicon layers 111 and 112 increased as shown in FIG. 5.

For example, as shown in FIG. 5, when the deposition rate was within the range of 0.5 nm/sec to 2.0 nm/sec, the defect density inside the intrinsic amorphous silicon layers 111 and 112 was 10^12 or less. However, when the deposition rate was out of the range of 0.5 nm/sec to 2.0 nm/sec, the defect density inside the intrinsic amorphous silicon layers 111 and 112 greatly increased to 10^12 or more.

A reason why the defect density inside the intrinsic amorphous silicon layers 111 and 112 increases to 10^12 or more when the deposition rate is 0.5 nm/sec or less is because the silicon crystals inside the intrinsic amorphous silicon layers 111 and 112 increase due to the epitaxial growth.

Further, a reason why the defect density inside the intrinsic amorphous silicon layers 111 and 112 increases to 10^12 or more when the deposition rate is 2.0 nm/sec or more is because an amount of hydrogen contained in the intrinsic amorphous silicon layers 111 and 112 is not sufficient and increases a defect.

As a result, the embodiment of the invention limits the deposition rate of the intrinsic amorphous silicon layers 111 and 112 in the intrinsic amorphous silicon layer deposition operation S1 to 0.5 nm/sec to 2.0 nm/sec.

Further, the deposition rate of the intrinsic amorphous silicon layers 111 and 112 may depend on a power density of a deposition device and a dilution ratio of a deposition gas supplied to the inside of the deposition device in the intrinsic amorphous silicon layer deposition operation S1. This will be described in detail below.

Figure 6:
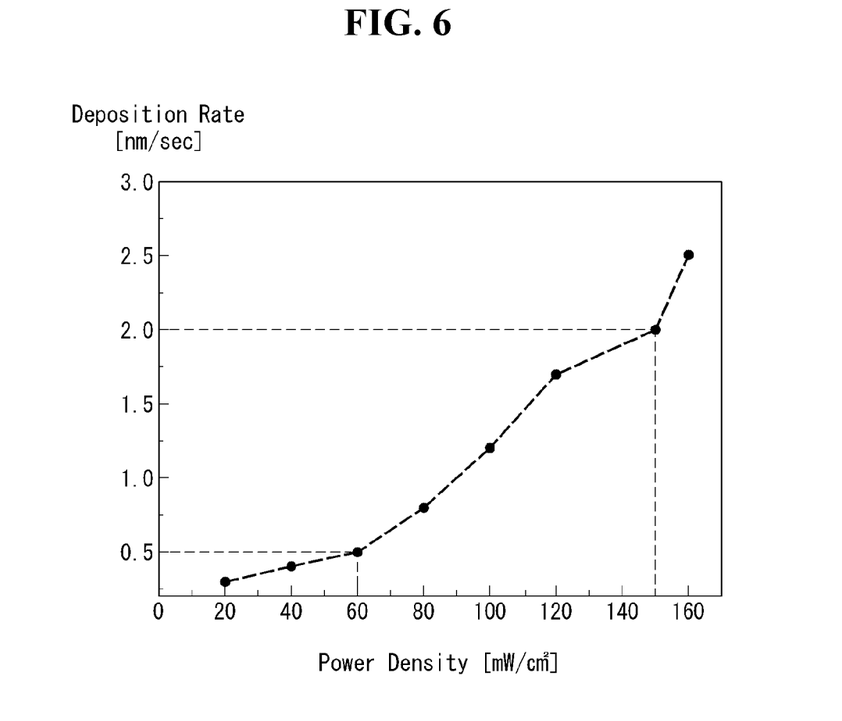
FIG. 6 illustrates an experimental example for explaining a relationship between a power density and a deposition rate of a deposition device when intrinsic amorphous silicon is deposited on a surface of a semiconductor substrate in a manufacturing method of FIG. 3.

FIG. 6 illustrates an experimental example for explaining a relationship between a power density and a deposition rate of a deposition device when intrinsic amorphous silicon is deposited on a surface of a semiconductor substrate in a manufacturing method of FIG. 3.

As shown in FIG. 6, the embodiment of the invention can limit a power density of a deposition device for depositing the intrinsic amorphous silicon layers 111 and 112 to 60 mW/cm² to 150 mW/cm², so that the deposition rate of the intrinsic amorphous silicon layers 111 and 112 is 0.5 nm/sec to 2.0 nm/sec.

More specifically, as shown in FIG. 6, when the power density of the deposition device for depositing the intrinsic amorphous silicon layers 111 and 112 is 60 mW/cm² or less, the deposition rate of the intrinsic amorphous silicon layers 111 and 112 may decrease to 0.5 nm/sec or less. Further, when the power density of the deposition device for depositing the intrinsic amorphous silicon layers 111 and 112 is 150 mW/cm² or more, the deposition rate of the intrinsic amorphous silicon layers 111 and 112 may increase to 2.0 nm/sec or more.

Figure 7:
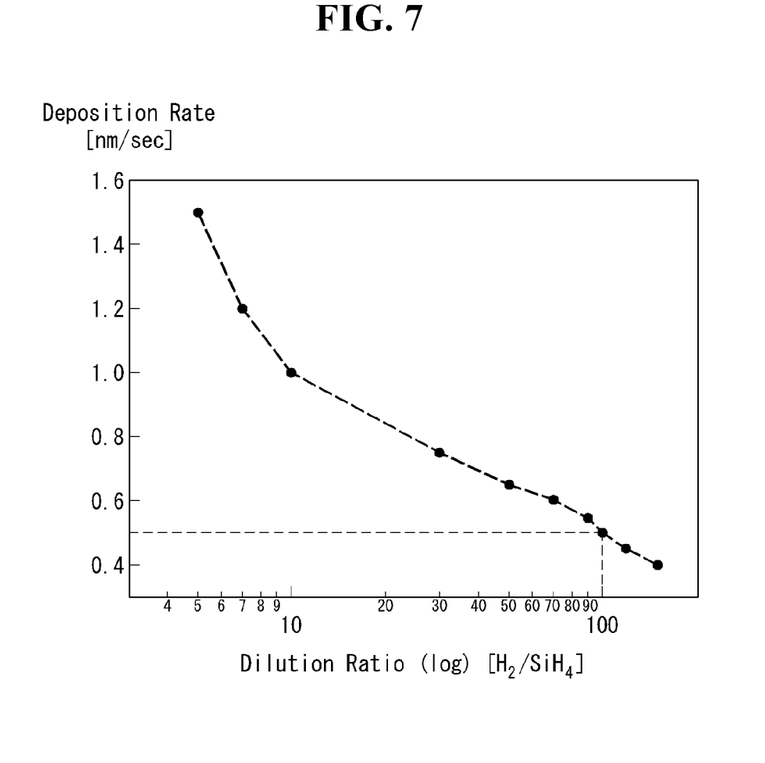
FIG. 7 illustrates an experimental example for explaining a relationship between a dilution ratio of an amount (sccm) of hydrogen gas ($H_2$) to an amount (sccm) of silane ($SiH_4$) gas and a deposition rate when intrinsic amorphous silicon is deposited on a surface of a semiconductor substrate in a manufacturing method of FIG. 3.

FIG. 7 illustrates an experimental example for explaining a relationship between a dilution ratio of an amount (sccm) of hydrogen gas ($H_2$) to an amount (sccm) of silane ($SiH_4$) gas and a deposition rate when intrinsic amorphous silicon is deposited on a surface of a semiconductor substrate in a manufacturing method of FIG. 3.

As shown in FIG. 7, the embodiment of the invention can limit a dilution ratio ($H_2/SiH_4$) of an amount (sccm) of hydrogen gas ($H_2$) to an amount (sccm) of silane ($SiH_4$) gas for depositing the intrinsic amorphous silicon layers 111 and 112 to 1:1 to 1:100, so that the deposition rate of the intrinsic amorphous silicon layers 111 and 112 is 0.5 nm/sec to 2.0 nm/sec.

As shown in FIG. 7, a reason why the dilution ratio ($H_2/SiH_4$) of the amount (sccm) of hydrogen gas ($H_2$) to the amount (sccm) of silane ($SiH_4$) gas is limited to 1:100 or less is because the deposition rate of the intrinsic amorphous silicon layers 111 and 112 decreases to 0.5 nm/sec or less when the dilution ratio ($H_2/SiH_4$) exceeds 1:100.

As described above, the embodiment of the invention can prevent the epitaxial growth of the intrinsic amorphous silicon layers 111 and 112 by properly controlling the process conditions of the operation of depositing the intrinsic amorphous silicon layers 111 and 112 on the surface of the semiconductor substrate 110. Further, the embodiment of the invention can sufficiently secure an amount of hydrogen contained in the intrinsic amorphous silicon layers 111 and 112 and reduce the defect of the intrinsic amorphous silicon layers 111 and 112 to a predetermined level or less, thereby further improving the open-circuit voltage Voc of the solar cell.

So far, an effect obtained by limiting the deposition rate of the first and second intrinsic amorphous silicon layers 111 and 112 to 0.5 nm/sec to 2.0 nm/sec was described.

The deposition rates of the first and second intrinsic amorphous silicon layers 111 and 112 may be different from each other within the above range. This is described in detail below.

Figure 8:
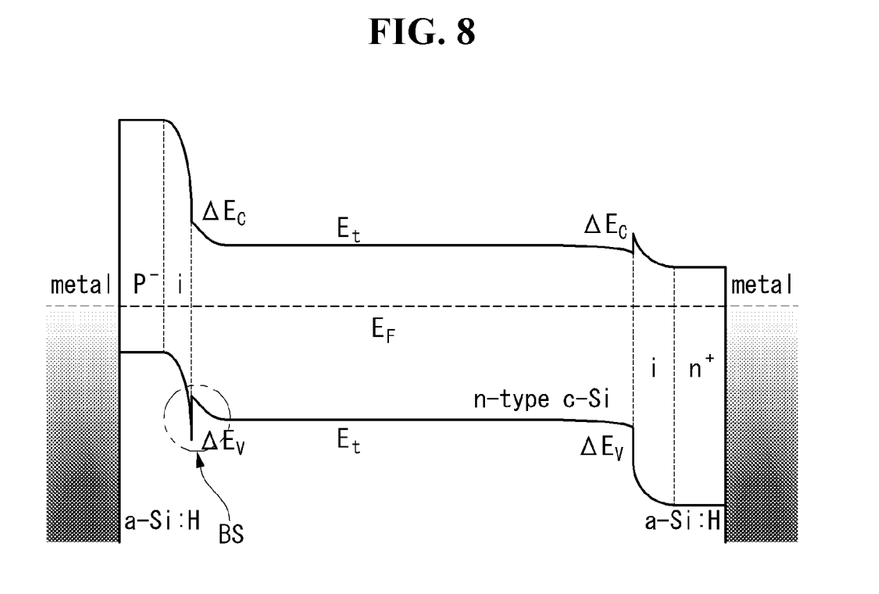
FIG. 8 illustrates an example of a related art band diagram for explaining an effect obtained by differently setting deposition rates of first and second intrinsic amorphous silicon layers.

FIG. 8 illustrates an example of a related art band diagram for explaining an effect obtained by differently setting deposition rates of first and second intrinsic amorphous silicon layers.

In the solar cell according to the embodiment of the invention, the first intrinsic amorphous silicon layer 111 may be formed on the first surface of the semiconductor substrate 110, and the second intrinsic amorphous silicon layer 112 may be formed on the second surface of the semiconductor substrate 110.

When the first conductive region 120 and the semiconductor substrate 110 form a p-n junction with the first intrinsic amorphous silicon layer 111 interposed therebetween, a deposition rate of the first intrinsic amorphous silicon layer 111 positioned on the first surface of the semiconductor substrate 110, on which the first conductive region 120 forming the p-n junction is deposited, may be different from a deposition rate of the second intrinsic amorphous silicon layer 112.

More specifically, the deposition rate of the first intrinsic amorphous silicon layer 111 may be greater than the deposition rate of the second intrinsic amorphous silicon layer 112.

When the deposition rate of the first intrinsic amorphous silicon layer 111 is greater than the deposition rate of the second intrinsic amorphous silicon layer 112 as described above, a magnitude of a bandgap spike BS formed between the first intrinsic amorphous silicon layer 111 and the semiconductor substrate 110 can decrease.

More specifically, for example, when an intrinsic amorphous silicon layer and an amorphous silicon layer containing impurities are deposited on an n-type crystalline silicon substrate (n-type C—Si), a band diagram shown in FIG. 8 may be formed.

The magnitude of the bandgap spike BS may greatly increase at a valence band Et formed at a junction surface between an intrinsic amorphous silicon layer (i-a-Si:H), on which a $p^+$-type amorphous silicon layer ($p^+$-a-Si:H) is positioned, and the n-type crystalline silicon substrate (n-type C—Si).

The bandgap spike BS may interfere with the flow of carriers (holes or electrons) and may be a factor reducing the efficiency of the solar cell.

However, the embodiment of the invention can decrease the magnitude of the bandgap spike BS formed between the first intrinsic amorphous silicon layer 111 and the semiconductor substrate 110 by relatively increasing the deposition rate of the first intrinsic amorphous silicon layer 111 positioned on the first surface of the semiconductor substrate 110, on which the first conductive region 120 forming the p-n junction is deposited, thereby further improve the efficiency of the solar cell.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a solar cell, the method comprising:

chemical vapor depositing a first intrinsic amorphous silicon layer on a first surface of the semiconductor substrate formed of single crystalline silicon and a second intrinsic amorphous silicon layer on a second surface opposite the first surface of the semiconductor substrate;

chemical vapor depositing a first conductive region formed of an amorphous silicon layer containing impurities of a first conductivity type opposite a conductivity type of the semiconductor substrate on the first intrinsic amorphous silicon layer and a second conductive region formed of an amorphous silicon layer containing impurities of a second conductivity type opposite the first conductivity type on the second intrinsic amorphous silicon layer; and forming a first electrode electrically connected to the first conductive region and a second electrode electrically connected to the second conductive region, wherein the chemical vapor depositing of the first and second intrinsic amorphous silicon layers includes each depositing intrinsic amorphous silicon on the surface first and second surfaces of the semiconductor substrate formed of the single crystal silicon at a deposition rate of 0.5 nm/sec to 2.0 nm/sec, wherein a bandgap energy of the solar cell including the intrinsic amorphous silicon layer is approximately 1.8 eV to approximately 2.0 eV based on the deposition rate of 0.5 nm/sec to 2.0 nm/sec, wherein a ratio of an amount (sccm) of hydrogen gas ($H_2$) to an amount (sccm) of silane ($SiH_4$) gas for chemical vapor depositing the intrinsic amorphous silicon layer is 1:5 to 1:100, and wherein a deposition rate of the first intrinsic amorphous silicon layer is greater than the deposition rate of the second intrinsic amorphous silicon layer.

2. The method of claim 1, wherein a power density of a deposition device for chemical vapor depositing the first and second intrinsic amorphous silicon layers is approximately 60 mW/cm$^2$ to approximately 150 mW/cm$^2$.

3. The method of claim 1, wherein a process temperature in the chemical vapor depositing of the first and second intrinsic amorphous silicon layers is approximately 100° C. to approximately 200° C.

4. The method of claim 1, further comprising forming a first transparent electrode layer formed of transparent conductive oxide on the first conductive region and a second transparent electrode layer formed of transparent conductive oxide on the second conductive region respectively between the forming of the first and second conductive regions and the forming of the first and second electrodes, wherein in the forming of the first and second electrodes, the first electrode is connected to the first transparent electrode layer and the second electrode is connected to the second transparent electrode layer.

5. The method of claim 1,
wherein the first conductive region and the semiconductor substrate form a p-n junction with the first intrinsic amorphous silicon layer interposed therebetween.

6. The method of claim 1, wherein a thickness of each of the first and second intrinsic amorphous silicon layers deposited is 0.5 nm to 2.5 nm.

7. A method of manufacturing a solar cell, the method comprising:

depositing an intrinsic amorphous silicon layer on a first surface and a second surface opposite the first surface of a semiconductor substrate formed of single crystal silicon to form a first amorphous tunneling layer and a second amorphous tunneling layer each lacking crystalline silicon;

depositing a first conductive region formed of an amorphous silicon layer containing impurities of a first conductivity type opposite a conductivity type of the semiconductor substrate on the first amorphous tunneling layer and a second conductive region formed of an amorphous silicon layer containing impurities of a second conductivity type opposite the first conductivity type on the second amorphous tunneling layer; and forming a first electrode electrically connected to the first conductive region and a second electrode electrically connected to the second conductive region, wherein the depositing of the intrinsic amorphous silicon layer includes depositing intrinsic amorphous silicon on the surface of the semiconductor substrate at a deposition rate of 0.5 nm/sec to 2.0 nm/sec, wherein a bandgap energy of the solar cell including the intrinsic amorphous silicon layer is approximately 1.8 eV to approximately 2.0 eV based on the deposition rate of 0.5 nm/sec to 2.0 nm/sec, wherein a ratio of an amount (sccm) of hydrogen gas ($H_2$) to an amount (sccm) of silane ($SiH_4$) gas for depositing the intrinsic amorphous silicon layer is 1:5 to 1:100, and wherein a deposition rate of the first amorphous tunneling layer is greater than the deposition rate of the second amorphous tunneling layer.

8. The method of claim 7, wherein the deposition rate of the intrinsic amorphous silicon layer is approximately 1.0 nm/sec to approximately 1.25 nm/sec.

9. The method of claim 7, wherein a power density of a deposition device for depositing the intrinsic amorphous silicon layer is approximately 60 mW/cm$^2$ to approximately 150 mW/cm$^2$.

10. The method of claim 9, wherein the power density is approximately 90 mW/cm$^2$ to approximately 100 mW/cm$^2$.

11. The method of claim 7, wherein a process temperature in the depositing of the intrinsic amorphous silicon layer is approximately 100° C. to approximately 200° C.

12. The method of claim 7, wherein a thickness of each of the first and second amorphous tunneling layers deposited is 0.5 nm to 2.5 nm.

* * * * *